United States Patent [19]
Kurosaki

[11] Patent Number: 6,160,736
[45] Date of Patent: Dec. 12, 2000

[54] MEMORY CIRCUIT FOR CHANGING BOOST RATIO

[75] Inventor: Kazuhide Kurosaki, Kawasaki, Japan

[73] Assignee: Fujitsu Limited, Kawasaki, Japan

[21] Appl. No.: 09/245,716

[22] Filed: Feb. 8, 1999

[30] Foreign Application Priority Data

Aug. 7, 1998 [JP] Japan ................................. 10-223968

[51] Int. Cl.$^7$ ................................................. G11C 11/34
[52] U.S. Cl. ....................................................... 365/185.23
[58] Field of Search ..................... 365/185.15, 185.25, 365/185.23

[56] References Cited

U.S. PATENT DOCUMENTS 5,986,935  11/1999  Iyama et al. ..................... 365/185.18

*Primary Examiner*—David Nelms
*Assistant Examiner*—M. Tran
*Attorney, Agent, or Firm*—Arent Fox Kintner Plotkin & Kahn PLLC

[57] ABSTRACT

The present invention is a memory circuit having memory cell array transistors with floating gates, wherein the boost ratio of the boosted voltage generating circuit is varied so that the boosted voltage level for driving wordlines during reading becomes constant depending on the power source voltage level. Specifically, when the power source voltage decreases, the boost ratio increases and when the power source voltage increases, the boost ratio decreases. As a result, the boosted voltage for driving wordlines during reading can be maintained within a prescribed range and appropriate read operations can be ensured.

7 Claims, 8 Drawing Sheets

CURRENT-VOLTAGE CHARACTERISTICS OF MEMORY CELL TRANSISTOR

VPW BOOSTER CIRCUIT (1)

TIMING CHART FOR BOOSTER CIRCUIT IN FIG. 3

HIGH $V_{CC}$

LOW $V_{CC}$ 60, 61 BOOSTER PORTION

VPW BOOSTER CIRCUIT (2)

VPW BOOSTER CIRCUIT (3)

FIG. 8A  TIMING CHART OF FIG. 7
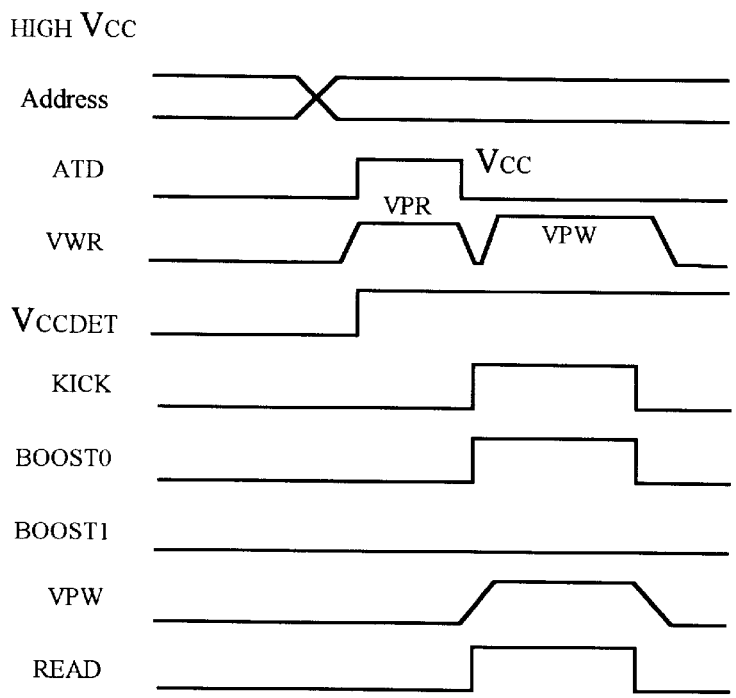
FIG. 8B
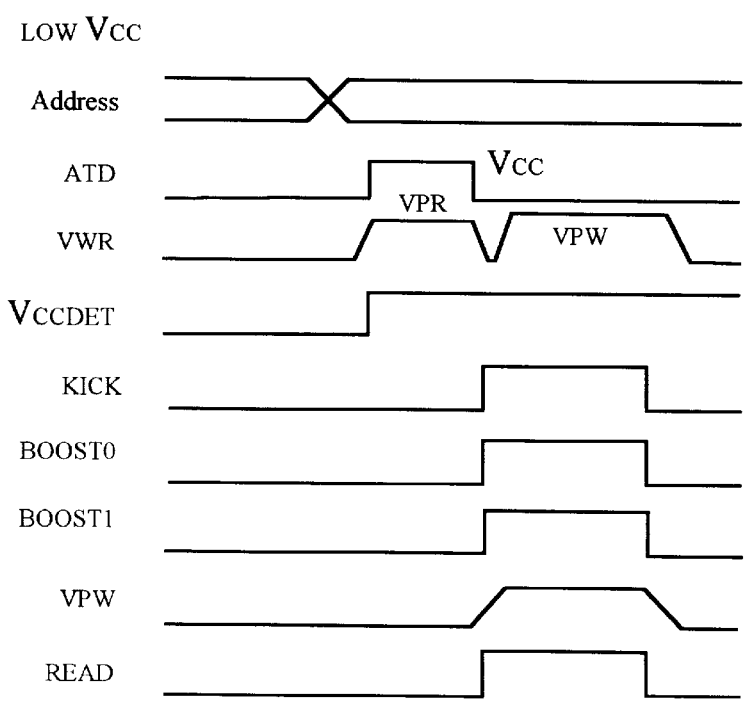

MEMORY CIRCUIT FOR CHANGING BOOST RATIO

BACKGROUND OF THE INVENTION

1. Field of the Invention

The present invention relates to a memory circuit having non-volatile memory such as flash memory, and more particularly to a memory circuit which can optimize the level of boosted voltage when driving wordlines at the boosted voltage to which a power source voltage is boosted by a prescribed ratio.

2. Description of the Related Art

Memory devices such as EEPROM or flash memory, which is a type of non-volatile memory, use MOS transistors having floating gates as the memory cells. Writing (programming) by adding electrons to the floating gate results in a storage state of data 0; erasing by pulling electrons from the floating gates results in a storage state of data 1. The control gates connected to the wordlines are driven at prescribed high voltages and the different threshold values of the memory cell transistors, which differ according to the storage states, are read by the presence or non-presence of electric current.

With recent requirements for reducing voltage, lower power source voltages of 2.7–3.6 V, for example, are the trend. On the other hand, the MOS transistors with floating gates which constitute memory cells require that wordlines be driven at higher voltages of 5.5 V, for example, in order to detect different threshold values during reading. Consequently, a boosted voltage generating circuit is provided internally; the boosted voltage generating circuit raises the power source voltage Vcc and generates a boosted voltage VPW which is at the wordline driving level during reading. The operation of boosting the power source voltage Vcc to a prescribed ratio is carried out by this boosted voltage generating circuit.

However, the wordline voltage during reading has upper and lower limits for the following reasons. The control gates of a plurality of memory cell transistors are connected to the wordlines. Consequently, the wordlines are driven as high as the boosted voltage for the memory cells selected for reading, and if the boosted voltage is too high, excess voltage is applied between the drains and control gates of the selected memory cell transistors; this may bring about the injection of electrons to the floating gate thereof and result in a slight writing operation. Consequently, the upper limit of the boosted voltage is set somewhat below the voltage at which the operation of writing to such a selected memory cell transistor is limited to some extent.

Meanwhile, the lower limit of the boosted voltage is set at a level which guarantees the reading of the programmed memory cell transistor. The erase operation of a transistor with a floating gate pulls electrons from the floating gate and causes the threshold voltage thereof to drop. Because of dispersion within the prescribed block, which is the unit erased, an excessive number of electrons is pulled from some of the memory cell transistors and the threshold voltages thereof become negative. As a result, even if the wordlines are maintained at ground, some leakage current will flow into such transistors. Consequently, in the case of the selection of memory cell transistors in the program state (data 0) on the same bitlines as this type of over-erased memory cell transistor, current should not flow to those bitlines in a proper operation, but leakage current from the aforementioned over-erased transistors is generated.

Meanwhile, a reference memory cell transistor for reading is provided for the read operation. The boosted voltage is applied to this reference memory cell transistor and the flowing current is used as the reference current for reading. Consequently, this reference current is set so as to be greater than the bitline current (allowable leakage current) when a program state cell transistor is selected and smaller than the bitline current when an erase state cell transistor is selected.

Consequently, normal reading of the program state memory cell transistor becomes impossible when the boosted voltage is reduced and the reference current of the reference memory cell transistor becomes less than the allowed leakage current value. This is the lower limit for the boosted voltage.

In addition to the recent demands for lowering power source voltage, the ability to comply to a broader range of power source voltages is required. For such power source voltages, the level of the internally produced boosted voltage must be between the aforementioned upper and lower limit values.

SUMMARY OF THE INVENTION

It is an object of the present invention to provide a non-volatile memory device for generating boosted voltage to ensure correct read operations for a broader range of power source voltages.

It is another object of the present invention to provide a non-volatile memory device for generating boosted voltage for driving wordlines to ensure correct read operations for a lower power source voltage.

In order to accomplish the aforementioned objects, the present invention is a memory circuit having memory cell array transistors with floating gates, wherein the boost ratio of the boosted voltage generating circuit is varied so that the boosted voltage level for driving wordlines during reading becomes constant depending on the power source voltage level. Specifically, when the power source voltage decreases, the boost ratio increases and when the power source voltage increases, the boost ratio decreases. As a result, the boosted voltage for driving wordlines during reading can be maintained within a prescribed range and appropriate read operations can be ensured.

More specifically, the present invention controls the boost ratio of the boosted voltage circuit so that the current of the reference transistor for reading, to which the boosted voltage is applied, remains greater than the allowed leakage current on the bitline from the memory cell transistor. As a result, appropriate read operations are ensured when the read operation is carried out on the basis of the relationship of the reference transistor current and the bitline current. Also, the boost ratio of the boosted voltage circuit is controlled so that the boosted voltage applied to the wordline is maintained at a level low enough that the prescribed write operation to the selected memory cell transistor is not carried out.

In order to achieve the aforementioned objects, the present invention is a memory circuit having non-volatile memory comprising:

a memory cell array having a plurality of wordlines, a plurality of bitlines, and non-volatile memory disposed at the intersections thereof;

a row decoder circuit for driving the wordlines at a boosted voltage level during reading; and a booster circuit for boosting a power source voltage to a predetermined ratio and generating the boosted voltage;

wherein the booster circuit varies the predetermined ratio according to the level of the power source voltage.

In order to achieve the aforementioned objects, the present invention is a memory circuit having non-volatile memory comprising:

a memory cell array having a plurality of wordlines, a plurality of bitlines, and non-volatile memory cell transistors disposed at the intersections thereof;

a row decoder circuit for driving the wordlines at a boosted voltage level during reading;

a reference memory cell transistor having the non-volatile memory cell transistor whose gate is driven at the boosted voltage;

a sense amp for detecting data of the memory cell transistors, corresponding to the currents of the reference memory cell transistor and the memory cell transistors within the memory cell array, during reading; and a booster circuit for boosting a power source voltage to a predetermined ratio and generating the boosted voltage;

wherein the booster circuit varies the predetermined ratio according to the level of the power source voltage.

Furthermore, the present invention varies the boost ratio, in the aforementioned inventions, in order that the boosted voltage level be held at a level so that the conductive current of the reference memory cell transistor is greater than a leakage current of the memory cell transistor.

BRIEF DESCRIPTION OF THE DRAWINGS

FIGS. 8A and 8B are timing charts showing the operation of the booster circuit in FIG. 7.

DESCRIPTION OF THE PREFERRED EMBODIMENTS

The preferred embodiments of the present invention are explained below with reference to the drawings. However, the technical scope of the present invention is not limited to these embodiments. The present invention can be broadly applied to non-volatile memory devices having memory cell transistors with floating gates, but the following embodiments are explained using an example of a flash memory, which is a type of non-volatile memory. Further, the non-volatile memory circuit according to the present invention can be embedded in a system LSI.

Figure 1:
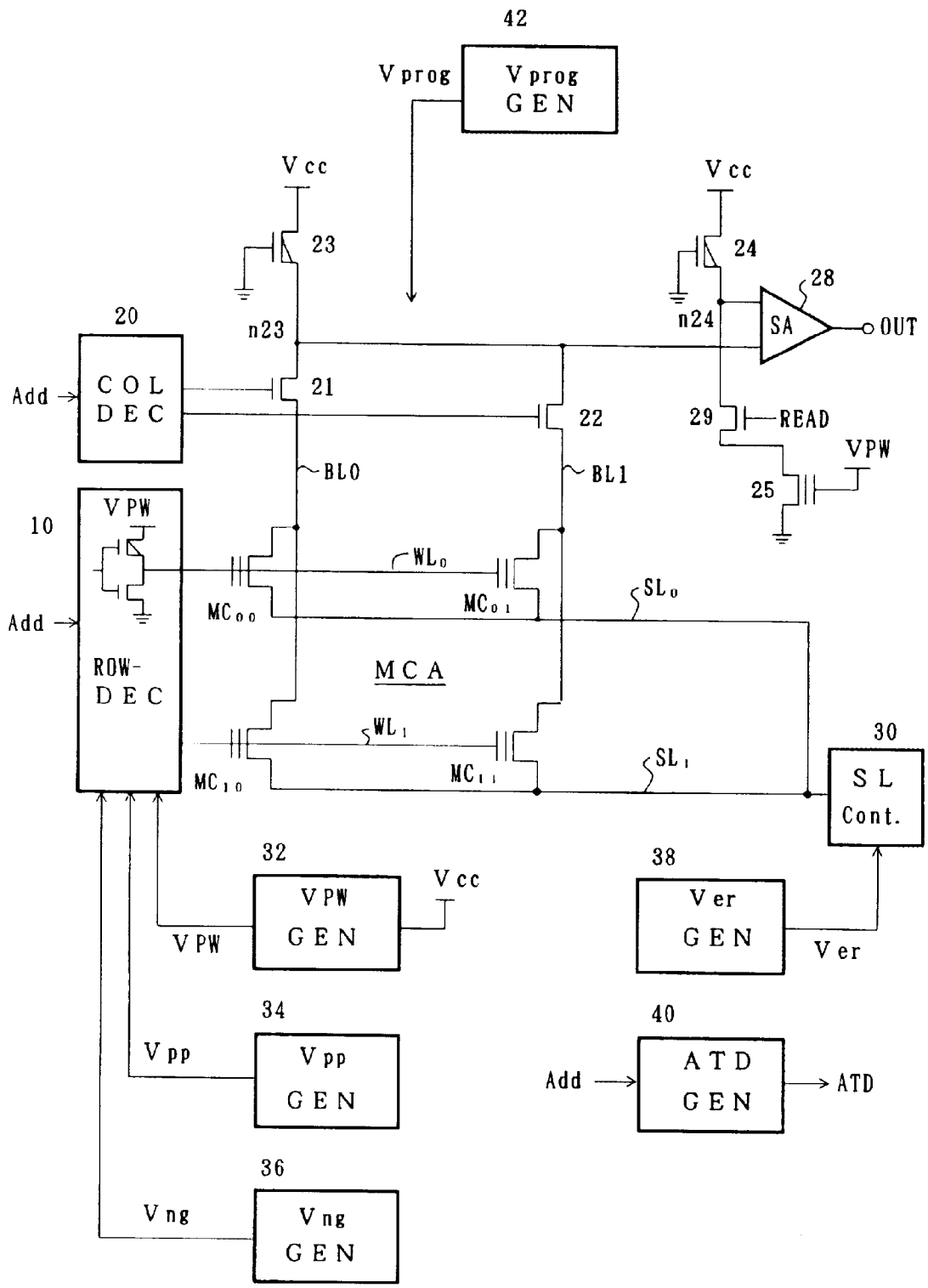
FIG. 1 is a drawing showing the overall constitution of flash memory.

FIG. 1 is a drawing showing the overall structure of flash memory. A plurality of wordlines WL and bitlines BL are disposed within the memory cell array; memory cells $MC_{00}$–$MC_{11}$, comprising N channel MOS transistors with floating gates, are provided at the intersections thereof. The source terminal of each memory cell transistor is connected to a source line SL and is controlled by a source line control circuit 30. The wordlines WL are selected by the row decoder 10 and driven at the prescribed voltage. The bitlines BL are connected to node n23 by means of the column selection transistors 21, 22, which are selected by the column decoder 20. The node n23 is connected to the power source $V_{cc}$ via a P channel MOS transistor 23. The gate of this P channel transistor 23 is connected to ground and the P channel transistor functions as a load transistor.

The reference transistor 25 for reading is connected to node n24 via a selection transistor 29 which is conductive during reading. This node n24 is also connected to the power source $V_{cc}$ via a P channel transistor 24, which is a load transistor. The node n23 and node n24 are inputs to the sense amp 28; according to the difference in potential of both, the sense amp 28 detects stored data in the memory cell transistor.

Corresponding voltages are applied to the control gate, drain, and source of a memory cell transistor with a floating gate and writing (programming), erasing, and reading are carried out. In other words, in the operation of writing to (programming) the memory cell transistor, a high voltage $V_{pp}$ for writing is applied to the control gate by means of the wordline WL, a relatively high voltage $V_{prog}$ for writing is applied to the drain by means of the bitline BL, and the source is put at ground potential by means of the source line SL. As a result, electrons are injected into the floating gate and the threshold voltage of the transistor rises; data 0 is thereby stored.

In the operation of erasing the memory cell transistor, negative voltage $V_{ng}$ is applied to the control gate by means of the wordline WL; the drain is put in a floating state and relatively high erase voltage $V_{er}$ is applied by means of the source line SL; and electrons within the floating gate are pulled to the source side. As a result, the threshold voltage of the memory cell transistor decreases and enters a state wherein data 1 is stored.

The read operation applies boosted voltage VPW for reading to the wordline WL and causes current to be generated by the bitline by making the memory cell transistor non-conductive (high threshold voltage) or conductive (low threshold voltage), depending on the difference in threshold voltage of the memory cell transistor. The potential of the node n23 varies because of this difference in current and is detected by the sense amp 28.

The voltages used in these operations, VPW, $V_{pp}$, $V_{ng}$, $V_{er}$, and $V_{prog}$ are generated by voltage generating circuits 32–42 respectively. The boosted voltage VPW is generated when the power source voltage Vcc is boosted to the predetermined ratio by the booster circuit 32 which is a VPW generating circuit.

Figure 2:
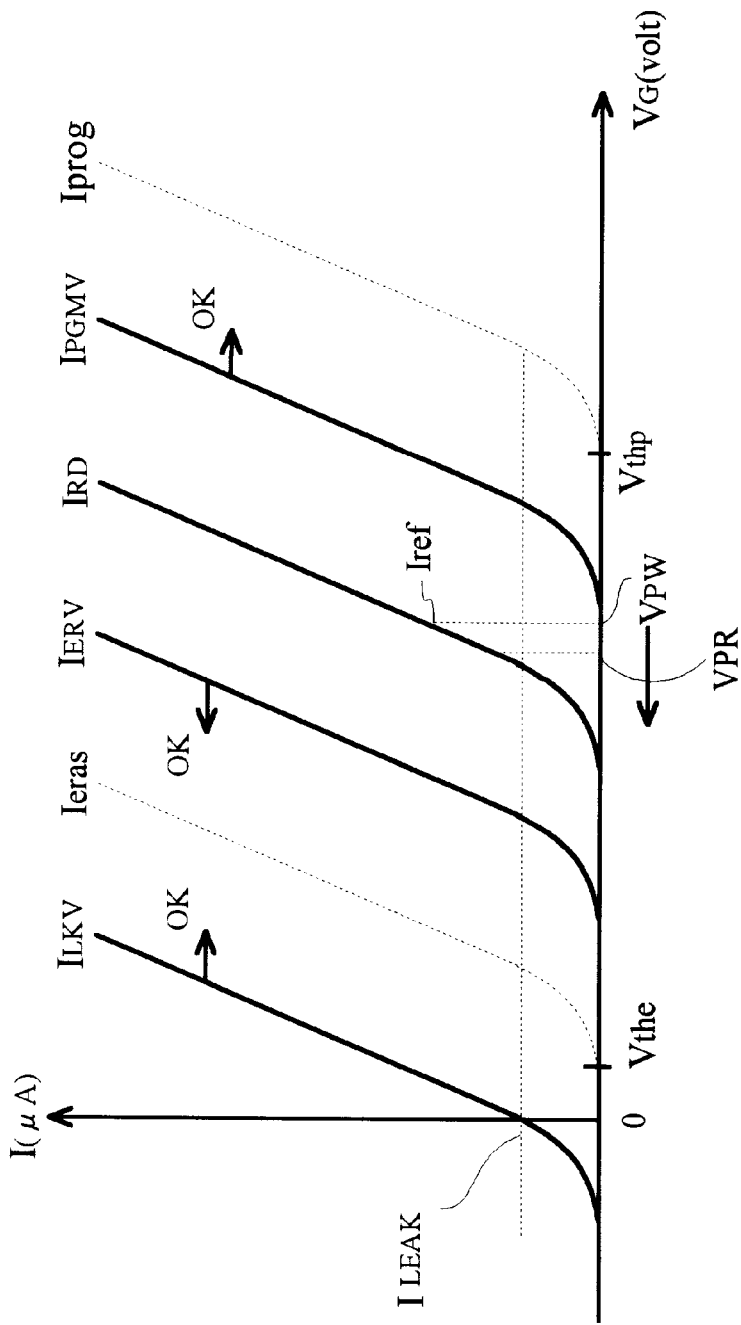
FIG. 2 shows the relationship between current and voltage characteristics of the memory cell transistor.

FIG. 2 shows the relationship between current and voltage characteristics of the memory cell transistor. The vertical axis shows current and the horizontal axis shows the voltage $V_G$ of the control gate. Consequently, the voltage $V_G$ of the control gate at which current starts to flow is the threshold voltage $V_{thp}$, $V_{the}$. In other words, as shown with the dotted lines, the threshold voltage $V_{thp}$ of the transistor becomes high in the program state (data 0) and the threshold voltage $V_{the}$ of the transistor becomes low in the erase state (data 1).

In the case of writing (programming), program verify is carried out to find whether enough electrons are injected in the floating gate. Specifically, in program verify, the aforementioned writing voltage is applied to the memory cell transistor and then it is checked whether the characteristic curve is located to the right of the program verify level $I_{PGMV}$.

In the case of erasing, an erase verify is carried out to find out whether enough electrons have been pulled from the floating gate. Specifically, in erase verify, the aforementioned erase voltage is applied to the memory cell transistor and then it is checked whether the characteristic curve is located to the left of the erase verify level $I_{ERV}$. Furthermore, a leak verify is also conducted to prevent an excessive number of electrons being pulled from the floating gate and the threshold voltage becoming too negative. Specifically, the conductive current of the memory cell transistor, when the control gate is at ground, is controlled so as to become less than the leakage current $I_{LEAK}$, which is within the allowable range. In other words, a memory cell transistor which has been excessively erased undergoes a slight writing operation again.

In the read operation, the wordline WL is driven at the boosted voltage VPW entered in FIG. 2. The change in potential of the node n23 is used to detect high current flowing through the bitline in the erase state and the lack of current in the program state.

As shown in FIG. 1, the reference transistor 25 for reading is established in the memory device. This reference transistor 25 is a MOS transistor with a floating gate like the memory cell transistors and the characteristic curve $I_{RD}$ is as shown in FIG. 2. Specifically, the curve $I_{RD}$ is positioned between the characteristic curve $I_{erase}$ of the erase state and the characteristic curve $I_{prog}$ of the program state of the memory cell transistor. The same boosted voltage VPW is then applied to the control gate of the reference transistor and selected memory cell transistor. As a result, the level of the node n24, due to the conductive current of the reference transistor 25, and the level of the node n23, due to the conductive current of the memory cell transistor, are detected correctly by the sense amp 28.

The significance of the aforementioned leak verify is understood in the context of such a read operation. Specifically, when memory cell transistors erased to excess are connected to the same bitline as the selected memory cell transistor, the leakage current of the unselected, over-erased memory cell transistor is high and it becomes impossible to detect the program state (conductive current is zero) of the selected memory cell transistor. Consequently, the leakage current on the bitline, from the memory cell transistor in the erase state, must be less than the current $I_{ref}$ of the reference transistor 25 for reading. In other words, $I_{LEAK} < I_{ref}$.

Meanwhile, as shown by the relationships of the current voltage characteristics in FIG. 2, the current $I_{ref}$ flowing from the reference transistor drops in the event of a drop in the boosted voltage VPW applied to the control gate of the memory cell transistor and reference transistor 25 during reading. Consequently, this boosted voltage VPW must be high enough that the current $I_{ref}$ of the reference transistor does not become less than the maximum leakage current $I_{LEAK}$. This determines the lower limit of the boosted voltage VPW.

Figure 3:
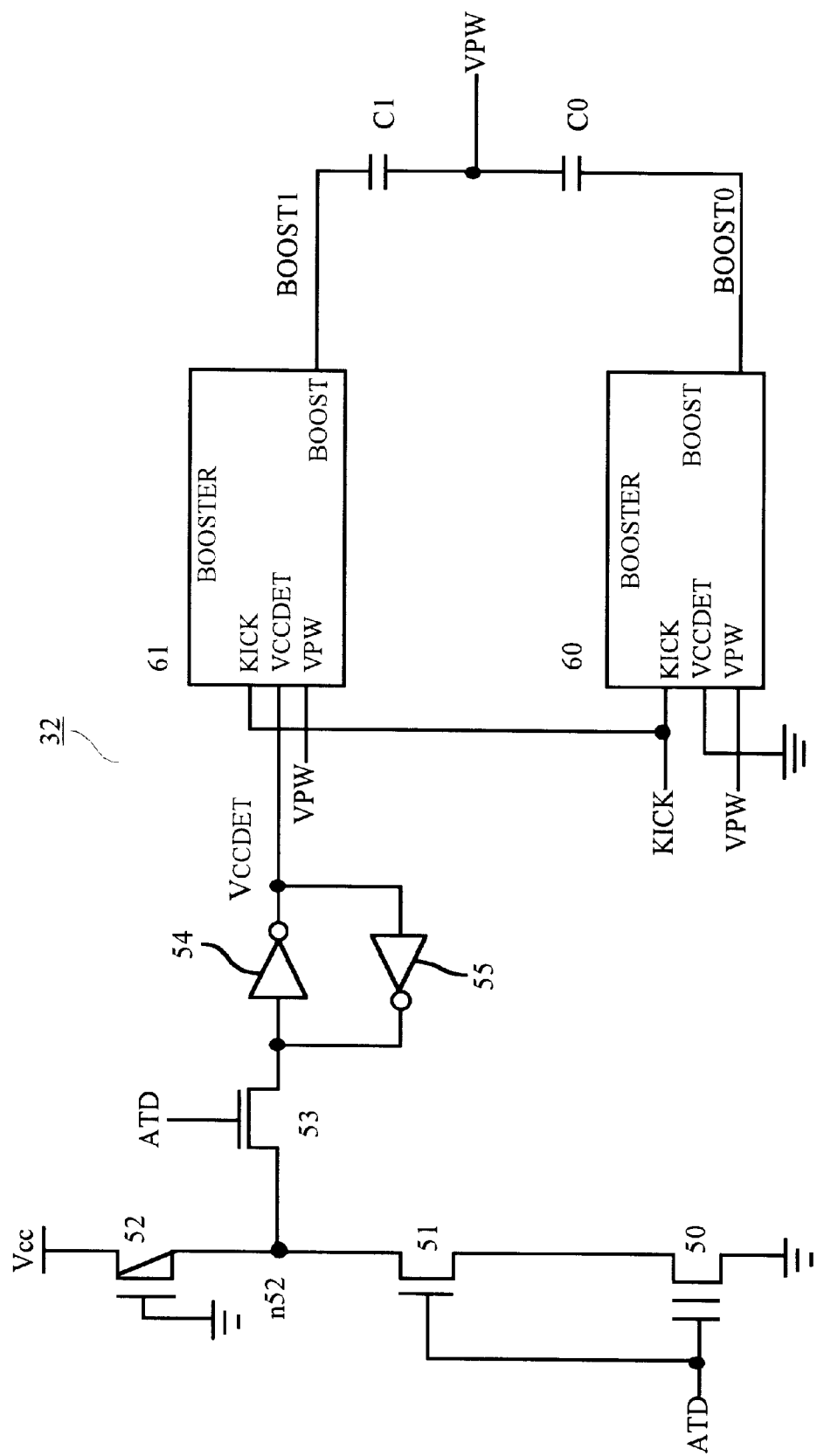
FIG. 3 is a diagram of a first example of the booster circuit for generating the boosted voltage VPW.

FIG. 3 is a diagram of a first example of the booster circuit for generating the boosted voltage VPW. This booster circuit comprises a transistor 50 having a predetermined threshold voltage for detecting the power source voltage. This transistor 50 is a MOS transistor with a floating gate, like the memory cell transistors. The transistor 50 is connected to an N channel transistor 51 and a P channel transistor 52; the node n52 is connected by means of a transistor 53 to a latch circuit comprising inverters 54 and 55. The output $V_{CCDET}$ of the latch circuit is supplied as an activating signal of the sub-booster portion 61. An address transition detection signal ATD, which detects address changes and becomes the power source voltage Vcc level, is supplied to the gates of the transistors 50, 51, 53. Consequently, the transistor 50 generates conductive current corresponding to the power source voltage Vcc level of the address change detection signal ATD.

The main booster portion 60 is in an active state when the activation signal $V_{CCDET}$ remains at L level. Consequently, in response to the driving pulse KICK, the main booster portion 60 outputs the boost signal BOOST0 and boosts the boosted voltage terminal VPW by means of the main capacitor $C_0$. Meanwhile, when the power source voltage Vcc drops, the drop in conductive current of the transistor 50 for detection is detected with the rise in potential of the node n52 and the latch circuit output $V_{CCDET}$ becomes L level. As a result, the sub-booster portion 61 is also activated. In response to the driving pulse KICK, the sub-booster portion 61 outputs a boost signal BOOST1 and further boosts the boosted voltage terminal VPW by means of the sub-capacitor $C_1$. The sub-capacitor $C_1$ has a smaller capacity than the main capacitor $C_0$. With the activation of the sub-booster portion 61, the boosted voltage VPW becomes a voltage which is boosted in a ratio corresponding to the capacity of the capacitor $C_1$.

Figure 4A:
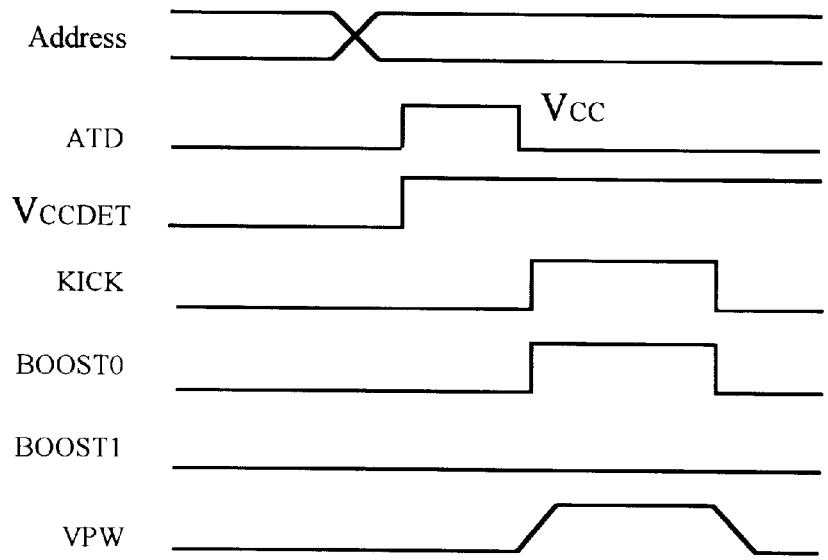
FIGS. 4A and 4B are timing charts showing the operation of the booster circuit in FIG. 3.
Figure 4B:
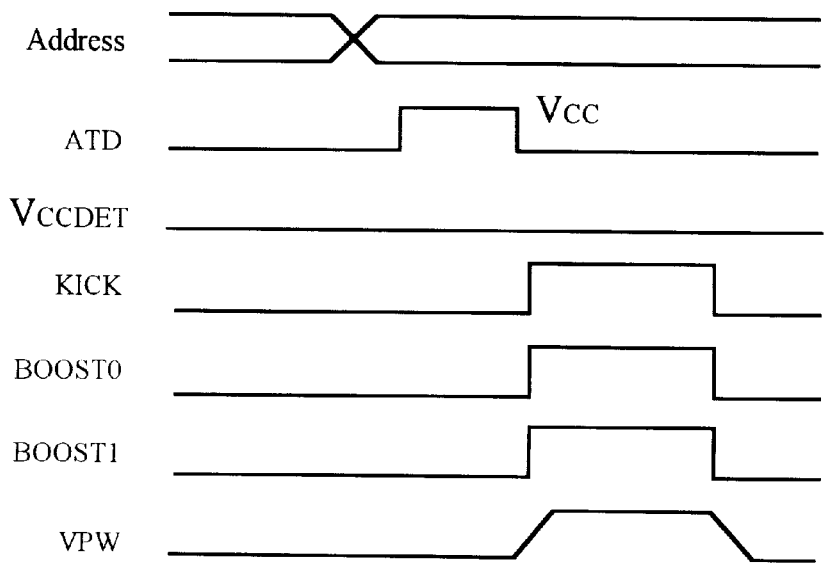

FIG. 4 is a timing chart showing the operation of the booster circuit in FIG. 3. FIG. 4A shows an operation when the power source voltage Vcc is high; FIG. 4B shows an operation when the power source voltage Vcc is low. When the address transition detection signal ATD is L level, the transistor 50 is non-conductive; the output VCCDET is L level when node n52 is H level.

The case where the power source voltage Vcc is sufficiently high is explained below. The address transition detection signal ATD, generated in response to address changes, temporarily becomes H level (power source voltage Vcc). Correspondingly, the gates of transistors 50, 51 are driven at the power source voltage Vcc and the transistor 50 enters a conductive state in response to the address transition detection signal ATD. Since the power source voltage Vcc is sufficiently high, the transistor 50 is sufficiently conductive and has low impedance; and the node n52 becomes low level. As a result, the activation signal $V_{CCDET}$ of the sub-booster portion 61 enters the H level which is inactive state.

As a result, only the main booster portion 60 is in the active state and the boosted voltage VPW is boosted by means only of the main capacitor $C_0$. In other words, this becomes a low boost ratio.

In the case where the source voltage Vcc is low, the address transition detection signal ATD becomes the power source voltage Vcc. In response, the gates of the transistors 50, 51 are driven at the power source voltage Vcc and the transistor 50 enters a conductive state in response to the signal ATD. Because the power source voltage Vcc is not sufficiently high, the transistor 50 is not sufficiently conductive and the conductive current thereof is low; and the node n52 becomes high level. As a result, the activation signal $V_{CCDET}$ of the sub-booster portion 61 enters the L level which is active state.

As a result, the sub-booster portion 61 enters the active state, as does the main booster portion 60; the boosted voltage VPW is boosted by means of the main capacitor $C_0$ and the sub-capacitor $C_1$. In other words, this becomes a high boost ratio.

Figure 5:
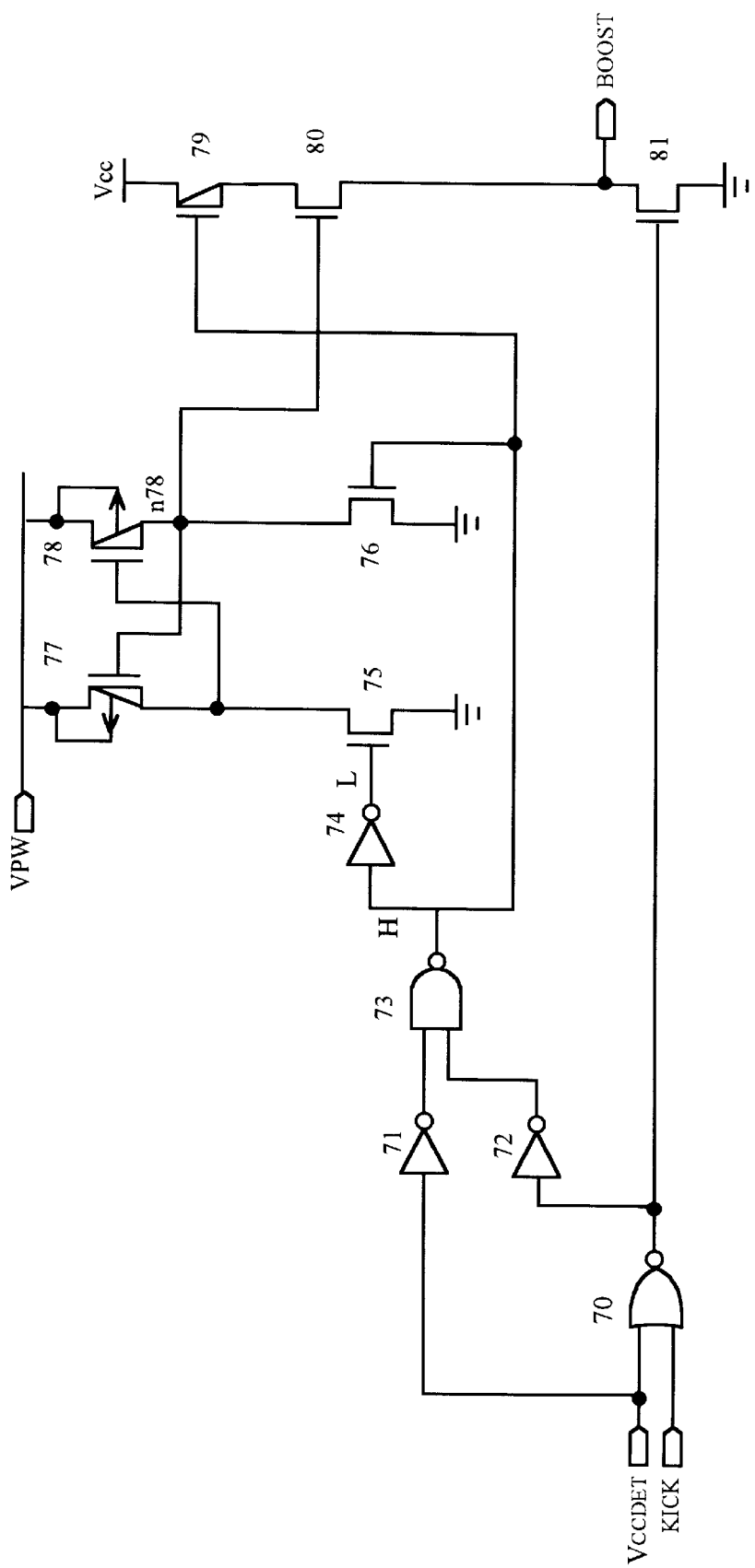
FIG. 5 is a circuit diagram of the booster portions 60, 61.

FIG. 5 is a circuit diagram of the booster portions 60, 61. The activation signal $V_{CCDET}$ and driving pulse KICK are supplied to the NOR gate 70. During the active state ($V_{CCDET}$=L), the output of the NOR gate 70 drives the N channel driving transistor 81 at the output stage. During the inactive state ($V_{CCDET}$=H), the output of the NOR gate 70 is forced to become L level and the transistor 81 enters a non-conductive state.

Meanwhile, another N channel driving transistor 80 at output stage is controlled by a boosted high level by the boosted voltage VPW. Specifically, the complementary signal of the output of the NAND gate 73 is supplied to the transistors 75, 76 of the level shift circuit comprising transistors 75–78; the node n78 is boosted to the boosted level VPW and drives the transistor 80. During the active state ($V_{CCDET}$=L), the output of the inverter 71 becomes H level and is supplied to one input of the NAND gate. The output of the NOR gate 70 is inverted by the inverter 72 and is supplied to the other input of the NAND gate 73. Consequently, the output of the NAND gate 73 becomes the same as the output of the NOR gate 70. Then, the output of the NAND gate 73 is inverted by the level shift circuit comprising transistors 75–78 and a boosted level is generated at the node n78. In effect, when the driving pulse KICK becomes H level, the transistor 81 becomes non-conductive and the transistor 80 becomes conductive and drives the boost signal BOOST to the source voltage Vcc level.

The output stage N channel transistor 80 is a transistor for preventing reverse flow when inactive. The boost signal BOOST is connected to the boosted voltage VPW by means of a capacitor, not shown. Consequently, when the boosted voltage VPW in the inactive state is boosted by another booster portion, the boost signal BOOST also becomes higher than the power source voltage Vcc due to capacitance coupling. Consequently, there is a risk of leakage current flowing from the boost signal BOOST side to the power source Vcc side. Therefore, the H level output of the NAND gate 73 during the inactive state makes the node n78 L level, the N channel transistor 80 non-conductive, and prevents current leakage to the power source voltage Vcc.

The booster portion in FIG. 5 is the circuit structure used for both the main booster portion and the sub-booster portion.

Figure 6:
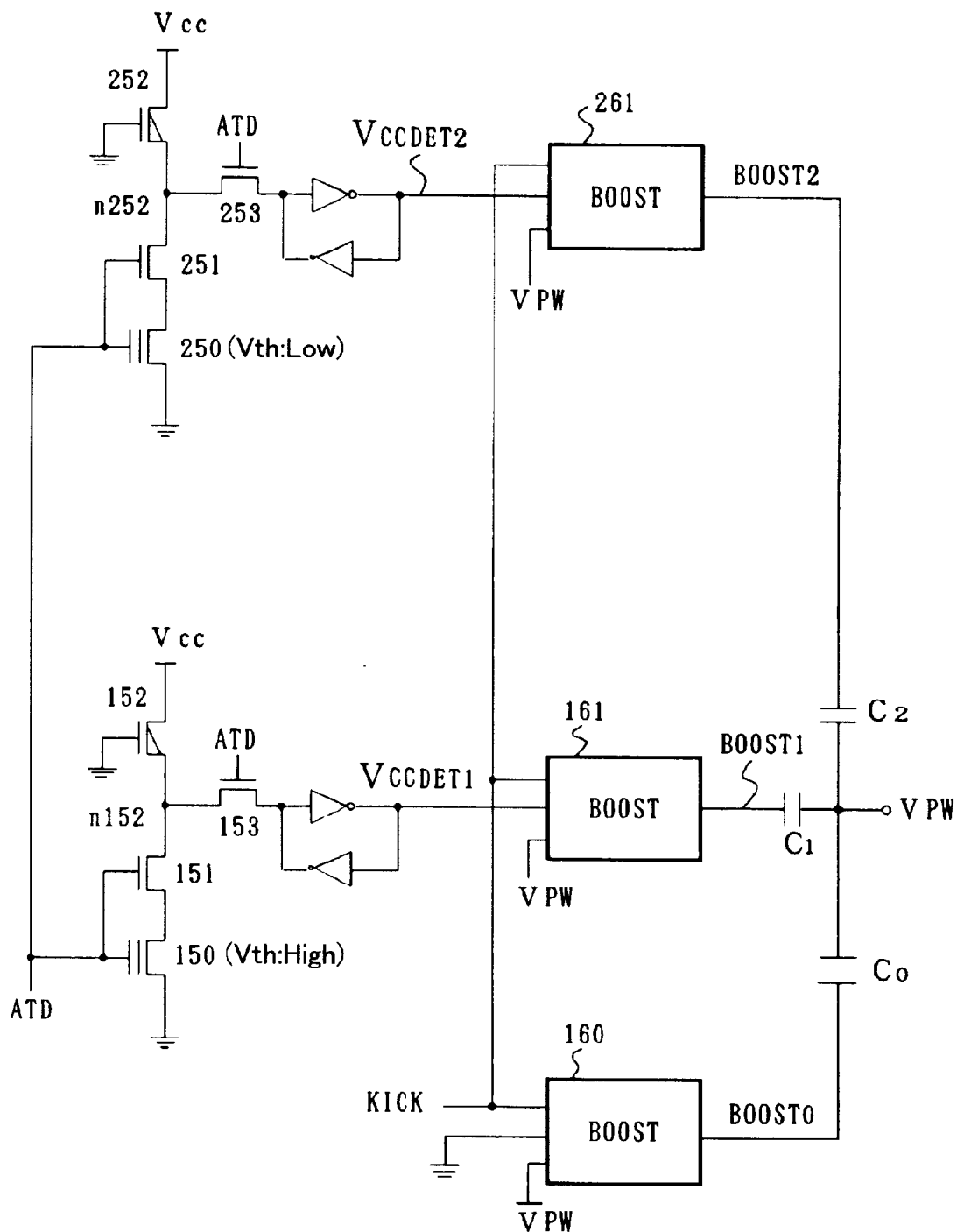
FIG. 6 is a circuit diagram of a second example of the booster circuit for generating the boosted voltage VPW.

FIG. 6 is a circuit diagram of a second example of the booster circuit for generating the boosted voltage VPW. This booster circuit is changed with a three level booster ratio according to the level of the power source voltage Vcc. Consequently, boosting capacitors $C_0, C_1, C_2$ are provided. By means of these capacitors, the boosted voltage VPW is boosted by boost signals BOOST0–2. As a result, when the power source voltage Vcc is at the target level, boost portions 160, 161 are activated. When the power source voltage Vcc is low, the boost portion 162 is activated as well and the boost ratio is increased. Also, when the power source voltage Vcc is high, the boost portion 161, as well as the booster portion 261, enter an inactive state and the boosted voltage VPW is boosted only by the boost signal BOOST0. Consequently, the boost ratio is decreased. As a result, the level of the boosted voltage VPW is maintained at the optimal level between the upper and lower limit values discussed above.

The circuit for generating the activation signals $V_{CCDET1}$ and $V_{CCDET2}$ of the boost portions 161, 261 in FIG. 6 is the same as that in FIG. 4. The circuit comprises the MOS transistors 150, 250 with floating gates; the threshold voltage of the transistor 150 is set higher than that of the transistor 250. Consequently, even when the H level power source voltage Vcc of the address transition detection signal ATD is applied to both, both transistors 150, 250 become conductive when the power source voltage Vcc is high, the nodes n152, 252 both become L level, and both activation signals $V_{CCDET}$ are made H level (inactive state). Next, when the power source voltage Vcc is at the target level, only the transistor 150 becomes non-conductive, the node n152 becomes H level, and the activation signal $V_{CCDET1}$ becomes L level (active state). Furthermore, when the source voltage Vcc decreases, both transistors 150, 250 become non-conductive, the nodes n152, n252 become H level, and both activation signals $V_{CCDET}$ become L level (active state).

For the boost capacitors $C_0, C_1, C_2$, the main capacitor $C_0$ has a large capacity while the other sub-capacitors $C_1, C_2$ have a comparatively small capacity. The booster portions 160, 161, 261 are the same as the circuit shown in FIG. 5.

Figure 7:
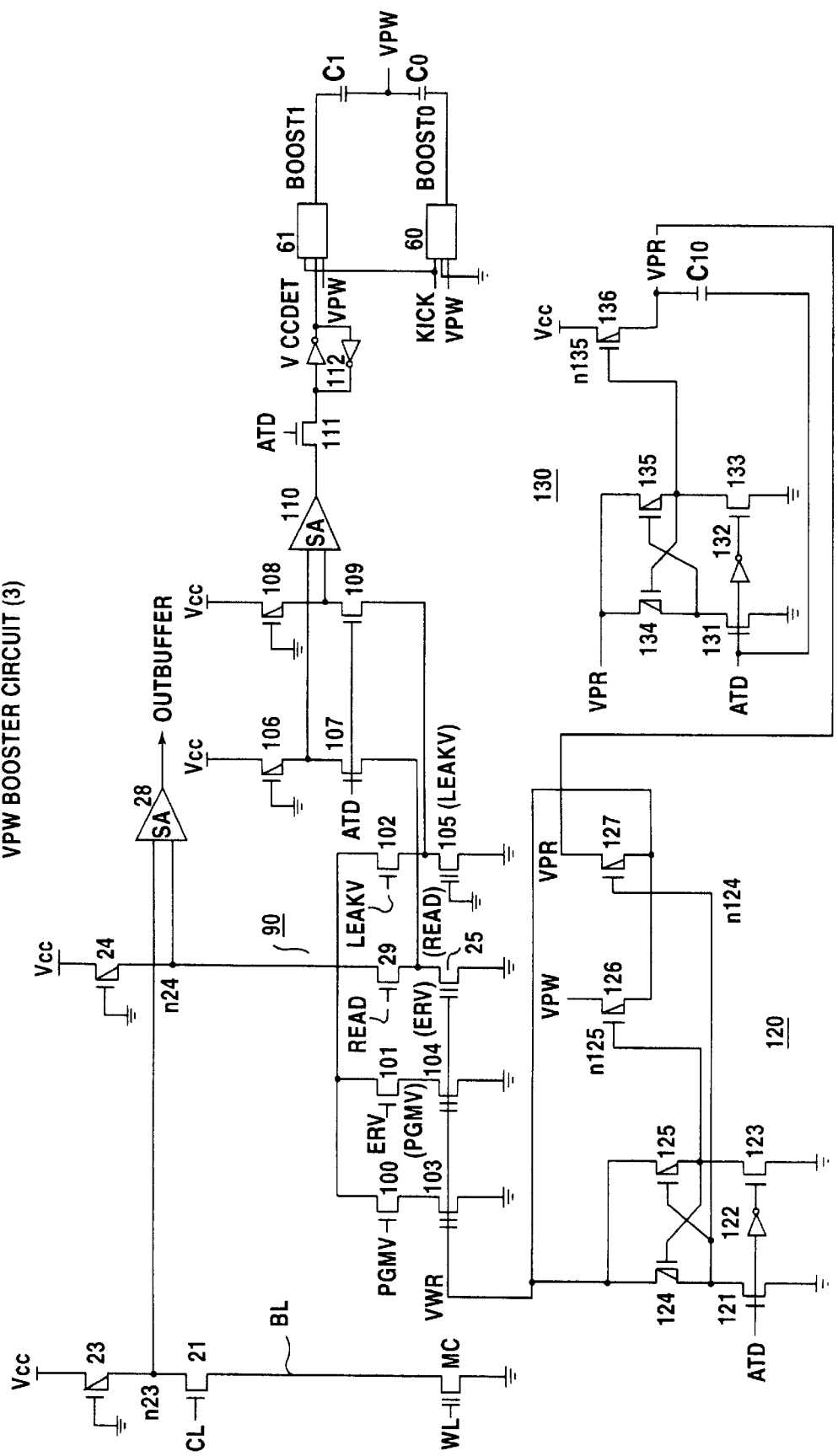
FIG. 7 is a circuit diagram of a third example of the booster circuit for generating the boosted voltage VPW.

FIG. 7 is a circuit diagram of a third example of the booster circuit for generating the boosted voltage VPW. FIG. 8 is a timing chart showing the operation of the booster circuit in FIG. 7. FIG. 7 includes a memory cell MC and sense amp 28 for reading, as well as the booster circuit. As shown in FIG. 1, the memory cell transistor MC is connected to wordlines WL and bitlines BL. The memory cell transistor MC is connected to a P channel transistor 23 by means of a column selection transistor 21, made conductive by the column selection signal CL. Depending on whether the memory cell transistor MC is in a program state or erase state, the memory cell transistor is non-conductive or conductive and the level of the node n23 is H level or L level. The node N23 becomes one input to the sense amp 28.

Meanwhile, a reference circuit 90 has a circuit structure with the same memory cell, bitlines, and so forth. In addition to the reference transistor 25 for reading shown in FIG. 1, the reference circuit 90 further comprises a program verify reference transistor 103 (PGMV), erase verify reference transistor 104 (ERV), and a leak verify reference transistor 105 (LEAKV). During their respective operations, these reference transistors constitute reference circuits, together with the P channel transistor 24, due to the conductivity of the corresponding selection transistors 29, 100–102 according to the selection signals READ, PGMV, ERV, LEAKV.

The aforementioned reference transistors 25, 103, 104, 105 are set at the threshold voltages having the current and voltage characteristics shown in FIG. 2. During the read, program verify, erase verify, and leak verify operations, the boosted voltage VPW at the wordline WL during reading is applied to the control gates of the reference transistors. And the read or particular verify operation is carried out by checking the output of the sense amp 28 which is determined by the current of the reference transistors and the current generated by the memory cell transistor MC. The particular verify operations are as explained with FIG. 2.

The booster circuit shown in FIG. 7 comprises a sub-booster portion 61, as well as the master booster portion 60, in order to guarantee the lower limit of the boosted voltage VPW, which is the driving voltage of the wordlines WL during reading. The master booster portion 60 is continually in an active state; the conductive current $I_{ref}$ of the reference transistor 25 for reading is kept sufficiently higher than the conductive current $I_{LEAK}$ of the reference transistor 105 for leak verify; and the sub-booster portion 61 is put in the appropriate active state. For this reason, the reference transistor 25 for reading and the reference transistor 105 for leak verify are connected to the P channel transistors 106, 108 by means of transistors 107, 109, made conductive by the address transition detection signal ATD. The contact points n106, n108 thereof are input to another sense amp 110. The activation signal $V_{CCDET}$ of the sub-booster 61 is output from the latch circuit 112 according to the output of the sense amp 110.

The combination of the circuit of transistors 25, 107, 106, the circuit of transistors 105, 109, 108, and the sense amp 110 is the same as the combination of the memory cell transistor for reading, bitlines BL, column selection transistor 21, load transistor 23, transistors 25, 29, 24, and the sense amp 28.

The circuit 120 is the circuit for generating the driving voltage VWR for the control gates of the reference transistors. This circuit 120 comprises N channel transistors 121, 123 and P channel transistors 124, 125, 126, 127. The circuit 120 normally supplies the boosted voltage VPW as the driving voltage VWR and temporarily supplies the voltage VPR as the driving voltage VWR in response to the address transition detection signal ATD. This voltage VPR is set to be slightly lower than the boosted voltage VPW when only the main booster portion 60 is in an active state.

The circuit 130 is a circuit for generating the voltage VPR and generates the voltage VPR, which is slightly lower than the boosted voltage VPW, in response to the address transition detection signal ATD. With a circuit comprising transistors 131, 133, 134, 135, the voltage of the node n135 is normally at L level and is controlled at the boosted voltage VPR level, when the address transition detection signal ATD is at H level. In other words, the address transition detection signal ATD is normally at L level and the node n135 is at L level as well. Consequently, the P channel transistor 136 is conductive and the capacitance $C_{10}$ is charged to the source Vcc level. Afterwards, when the address transition detection signal ATD becomes H level, the node n135 becomes H level and the transistor 136 becomes non-conductive. The voltage VPR is boosted by means of the capacitance $C_{10}$ in response to the rise of the address transition detection signal ATD. This voltage VPR is applied to the control gate of the reference transistor 25 for reading by means of the P channel transistor 127.

The voltage VPR is at a slightly lower level than the boosted voltage VPW during reading, as shown in FIG. 2. Consequently, the sense amp 110 detects whether the current value of the reference transistor 25 is lower than the leakage current $I_{LEAK}$. If lower, this means that the reference current $I_{ref}$ of the reference transistor 25 during an accompanying read operation is not set sufficiently higher than the leakage current $I_{LEAK}$; as discussed above, the read operation of the memory cell transistor in the program state cannot be properly conducted. Consequently, in this case, the output of the sense amp 110 becomes H level and the activation signal $V_{CCDET}$ becomes L level and causes the activation of the sub-booster 61. As a result, the boosted voltage VPW for reading is boosted to an optimal level corresponding to the low power source voltage Vcc and a proper read operation is guaranteed.

FIG. 8A is a timing chart for the case where the power source voltage Vcc is high. Following address transition, the address transition detection signal ATD is raised to the power source voltage Vcc. In response, the voltage VPR is boosted and applied as voltage VWR to the control gate of the reference transistor 25 (READ). At this time, the transistors 107, 109 are also conductive and the current of the reference transistor 25 for reading and the current $I_{LEAK}$ of the reference transistor 105 for leak verify are compared by the sense amp 110. In this example, the current of the reference transistor 25 for reading is sufficiently greater than the allowed leakage current $I_{LEAK}$ because the source voltage Vcc is sufficiently high. As a result, the output of the sense amp 110 becomes L level. Consequently, the activation signal $V_{CCDET}$ becomes H level (inactive) and the sub-booster circuit 61 enters an inactive state. Consequently the boost ratio enters a low state.

Afterwards, the boosted voltage VPW, boosted at that low boost ratio, is applied to the control gate of the reference transistor 25 for reading; the transistor 29 becomes conductive due to the read signal READ and the stored data in the memory cell is detected by the sense amp 28.

FIG. 8B is a timing charge of the case where the power source voltage Vcc is low. As above, the address transition detection signal ATD is raised to the power source voltage Vcc following an address change. In response thereto, the voltage VPR is boosted and applied as voltage VWR to the control gate of the reference transistor 25 (READ). At this time, the transistors 107, 109 are also conductive and the current of the reference transistor 25 for reading and the current $I_{LEAK}$ of the reference transistor 105 for leak verify are compared by the sense amp 110. In this example, the current of the reference transistor 25 for reading is equal to or lower than the allowed leakage current $I_{LEAK}$ because the power source voltage Vcc is low. As a result, the output of the sense amp 110 becomes H level. Consequently, the activation signal $V_{CCDET}$ becomes L level (active) and the sub-booster circuit 61 enters an active state. Consequently the boost ratio enters a high state.

Afterwards, the boosted voltage VPW, boosted at that high boost ratio, is applied to the control gate of the reference transistor 25 for reading; the transistor 29 becomes conductive due to the read signal READ and the stored data in the memory cell is detected by the sense amp 28.

As explained above, the present invention is a memory device having non-volatile memory, wherein the driving voltage of the wordlines during reading is generated by boosting the power source voltage at the predetermined ratio; because that boost ratio is varied depending on the level of the power source voltage, the boosted voltage can be continually maintained at the optimal level and a proper read operation can be guaranteed.

Furthermore, with the present invention, the boost ratio is controlled so that the boosted voltage, which becomes the wordline driving voltage during reading, is made high enough to normally carry out reading of an memory cell transistor in the program state even in the presence of allowable leakage current, and low enough to not carry out an excessive write operation for the selected memory cell transistor connected to the wordline to which the boosted voltage for reading is applied. Consequently, the present invention can guarantee proper read operations and prevent the application of extra disturb voltage to the unselected memory cell transistor.

What is claimed is:

1. A memory circuit, which includes non-volatile memory, comprising:
   a memory cell array having a plurality of word lines, a plurality of bit lines, and non-volatile memory disposed at the intersections thereof;
   a row decoder circuit for driving a word line at a boosted voltage level during reading; and
   a booster circuit for boosting a power source voltage with a predetermined ratio during reading to generate said boosted voltage;
   wherein said booster circuit varies said predetermined ratio according to the level of said power source voltage to maintain the boosted voltage within a prescribed range regardless of the change of the power source voltage.

2. A memory circuit, which includes non-volatile memory, comprising:
- a memory cell array having a plurality of word lines, a plurality of bit lines, and non-volatile memory disposed at the intersections thereof;
- a row decoder circuit for driving said word lines at a boosted voltage level during reading; and
- a booster circuit for boosting a power source voltage to a predetermined ratio and generating said boosted voltage;
- wherein said booster circuit varies said predetermined ratio according to the level of said power source voltage and said booster circuit detects the level of said power source voltage in response to an address transition detection signal detecting transitions of supplied address, and changes said predetermined ratio according to the detected level.

3. A memory circuit, which includes non-volatile memory, comprising:
- a memory cell array having a plurality of word lines, a plurality of bit lines, and non-volatile memory cell transistors disposed at the intersections thereof;
- a row decoder circuit for driving a word line at a boosted voltage level during reading;
- a reference memory cell transistor having said non-volatile memory cell transistor whose gate is driven at said boosted voltage;
- a sense amp for detecting data of said memory cell transistors, corresponding to the currents of said reference memory cell transistor and the memory cell transistors within said memory cell array, during reading; and
- a booster circuit for boosting a power source voltage with a predetermined ratio during reading to generate said boosted voltage;
- wherein said booster circuit varies said predetermined ratio according to the level of said power source voltage to maintain the boosted voltage within a prescribed range regardless of the change of the power source voltage.

4. A memory circuit, which includes non-volatile memory, comprising:
- a memory cell array having a plurality of word lines, a plurality of bit lines, and non-volatile memory cell transistors disposed at the intersections thereof;
- a row decoder circuit for driving said word lines at a boosted voltage level during reading;
- a reference memory cell transistor having said non-volatile memory cell transistor whose gate is driven at said boosted voltage;
- a sense amp for detecting data of said memory cell transistors, corresponding to the currents of said reference memory cell transistor and the memory cell transistors within said memory cell array, during reading; and
- a booster circuit for boosting a power source voltage to a predetermined ratio and generating said boosted voltage;
- wherein said booster circuit varies said predetermined ratio according to the level of said power source voltage and said predetermined ratio is varied so that said boosted voltage level is controlled to a level so that the conductive current of said reference memory cell transistor is greater than the leakage current of said memory cell transistor.

5. The memory circuit according to claim 4, wherein:
- said predetermined ratio is varied to become a first boost ratio when said power source voltage is a first voltage, and to become a second boost ratio, higher than said first boost ratio, when said power source voltage is a second voltage which is lower than said first voltage.

6. The memory circuit according to claim 4, further comprising a leakage current reference transistor including said non-volatile memory cell transistor and generating the allowable leakage current; wherein:
- said predetermined ratio is varied to be further higher when the conductive current of said reference memory cell transistor becomes less than the conductive current of said leakage current reference transistor.

7. A memory circuit, which includes non-volatile memory, comprising:
- a memory cell array having a plurality of word lines, a plurality of bit lines, and non-volatile memory cell transistors disposed at the intersections thereof;
- a row decoder circuit for driving said word lines at a boosted voltage level during reading;
- a reference memory cell transistor having said non-volatile memory cell transistor whose gate is driven at said boosted voltage;
- a sense amp for detecting data of said memory cell transistors, corresponding to the currents of said reference memory cell transistor and the memory cell transistors within said memory cell array, during reading; and
- a booster circuit for boosting a power source voltage to a predetermined ratio and generating said boosted voltage;
- wherein said booster circuit varies said predetermined ratio according to the level of said power source voltage and said predetermined ratio is limited so that a prescribed write operation is not carried out for selected non-volatile memory cell transistor connected to the word lines when said word lines are driven at said boosted voltage.

* * * * *